(12) United States Patent
Manakli (10) Patent No.: US 9,250,540 B2
(45) Date of Patent: Feb. 2, 2016

(54) LITHOGRAPHY METHOD WITH COMBINED OPTIMIZATION OF RADIATED ENERGY AND DESIGN GEOMETRY

(75) Inventor: Serdar Manakli, Meyrie (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 554 days.

(21) Appl. No.: 13/641,128

(22) PCT Filed: Apr. 13, 2011

(86) PCT No.: PCT/EP2011/055863
§ 371 (c)(1),
(2), (4) Date: Nov. 14, 2012

(87) PCT Pub. No.: WO2011/128393
PCT Pub. Date: Oct. 20, 2011

(65) Prior Publication Data
US 2013/0201468 A1    Aug. 8, 2013

(30) Foreign Application Priority Data

Apr. 15, 2010 (FR) ...................................... 10 52862

(51) Int. Cl.
| | |
|---|---|
| *A61N 5/00* | (2006.01) |
| *G03B 27/32* | (2006.01) |
| *G03B 27/54* | (2006.01) |
| *G03F 7/20* | (2006.01) |
| *B82Y 10/00* | (2011.01) |
| *B82Y 40/00* | (2011.01) |
| *H01J 37/317* | (2006.01) |

(52) U.S. Cl.
CPC ............. *G03F 7/70558* (2013.01); *B82Y 10/00* (2013.01); *B82Y 40/00* (2013.01); *H01J 37/3174* (2013.01)

(58) Field of Classification Search
CPC ...... B82Y 10/00; B82Y 40/00; G03F 7/2059; G03F 7/2061; G03F 7/70425; G03F 7/70441; G03F 7/70558; H01J 37/3026; H01J 37/3174; H01J 37/3175; H01J 2237/31761; H01J 2237/31769; H01J 2237/31771; Y10S 430/143
USPC .......... 250/396 R, 398, 492.1–492.3; 355/53, 355/67, 77; 378/34, 35; 430/296, 942
See application file for complete search history.

(56) References Cited

U.S. PATENT DOCUMENTS

| | | | |
|---|---|---|---|
| 6,107,207 A | 8/2000 | Waas et al. | |
| 2002/0177056 A1* | 11/2002 | Ogino et al. | ................. 430/30 |

(Continued)

OTHER PUBLICATIONS

S. Manakli et al.: "New Electron Beam Proximity Effects Correction Approach for 45 and 32 nm Nodes", Japanese Journal of Applied Physics, Part 1, Aug. 4, 2006, pp. 6462-6467, vol. 45, No. 8A, The Japan Society of Applied Physics, XP002613385.

(Continued)

*Primary Examiner* — Colin Kreutzer
(74) *Attorney, Agent, or Firm* — Baker & Hostetler LLP (57) ABSTRACT

A lithography method for a pattern to be etched on a support, notably to a method using electron radiation with direct writing on the support. Hitherto, the methods for correcting the proximity effects for dense network geometries (line spacings of 10 to 30 nm) have been reflected in a significant increase in the radiated doses and therefore in the exposure time. According to the invention, the patterns to be etched are modified as a function of the energy latitude of the process, which allows a reduction of the radiated doses.

15 Claims, 10 Drawing Sheets

(56) References Cited

U.S. PATENT DOCUMENTS

| | | |
|---|---|---|
| 2003/0093767 A1 | 5/2003 | Murai et al. |
| 2006/0001688 A1 | 1/2006 | Chabreck et al. |
| 2007/0117032 A1* | 5/2007 | Sczyrba et al. ............... 430/30 |
| 2007/0166646 A1 | 7/2007 | Kim et al. |
| 2007/0194250 A1 | 8/2007 | Suzuki et al. |

OTHER PUBLICATIONS

H. Eisenmann et al.: "PROXECCO—proximity effect correction by convolution," Journal of Vacuum Science & Technology B, vol. 11, No. 6, Nov. 1, 1993, pp. 2741-2745, 37th International Symposium on Electron, Ion and Photon Beams Jun. 1-4, 1993, San Diego, CA, USA.

* cited by examiner

LITHOGRAPHY METHOD WITH COMBINED OPTIMIZATION OF RADIATED ENERGY AND DESIGN GEOMETRY

CROSS-REFERENCE TO RELATED APPLICATIONS

This application is a National Stage of International patent application PCT/EP2011/055863, filed on Apr. 13, 2011, which claims priority to foreign French patent application No. FR 10 52862, filed on Apr. 15, 2010, the disclosures of each of which are incorporated by reference in their entireties.

FIELD OF THE DISCLOSED SUBJECT MATTER

The present invention applies to the field of electronic lithography.

BACKGROUND

In order to enable patterns whose critical dimension is less than 50 nm to be etched, methods for correcting increasingly complex optical distortions must be incorporated in the optical photolithography methods both at the stage of the design and production of the masks and at the stage of exposure. The costs of the equipment and of the developments for a new generation of technology increase accordingly in very high proportions. These days, the critical dimensions that can be accessed in photolithography are greater than or equal to 65 nm. The 32-45 nm generation is currently being developed and there is no viable solution envisaged for the technology nodes of less than 22 nm. For its part, electronic lithography now makes it possible to etch 22 nm patterns; it does not require any mask and offers a fairly short development time, which allows for a better responsiveness and flexibility in the production of improvements to the technologies and to the designs. On the other hand, the production times are structurally substantially higher than in photolithography since a stepped exposure (using a "stepper") is required, whereas photolithography requires only a layered exposure. Furthermore, in electronic lithography as in photolithography, proximity effects occur, notably between adjacent lines of a pattern which are separated by only 10 to 30 nm. To guarantee the fidelity of the design, it is therefore necessary to correct these proximity effects. The methods of the prior art, notably those described in U.S. Pat. No. 6,107,207, produce these corrections by increasing the radiation doses at the line edge. This increase in dose is reflected in a new increase in the exposure times, which constitutes a very significant handicap to the widespread industrial use of this technology.

SUMMARY

The present invention resolves this problem by providing a method for the combined optimization of the energy of the electronic radiation applied and of the area of application which makes it possible to reduce, in significant proportions, the necessary increase in the radiation dose and therefore the exposure times.

To this end, the invention provides a lithography method based on radiation of at least one pattern to be etched on a resin-coated support comprising a step of calculation of the modulation of at least one radiated dose and a step of calculation of at least one adjustment to be made to said pattern to be etched in at least one direction of the support, wherein said adjustment is a function of the process energy latitude at the point where the radiated dose is received and in that the modulation of the radiated dose is modified according to said at least one adjustment of said at least one pattern.

Advantageously, the step of calculation of the modulation of at least one radiated dose is applied by convolution of said pattern with a distribution function of said radiated dose on said support.

Advantageously, said radiated dose is calculated before modulation within the constraint that the average radiated dose is substantially of a value of the sensitivity threshold of the resin which is chosen as a parameter.

Advantageously, the sensitivity threshold parameter of the resin is chosen to be substantially equal to 0.5.

Advantageously, the process energy latitude (EL) at the point where the radiated dose is received is one of the slope of the tangent at this point to the curve of the received doses, the contrast of the radiated doses and the dose slope.

Advantageously, the adjustment to be made to the pattern centered on one of the points of reception of a radiated dose in at least one direction is calculated as being equal to the oriented distance on the straight line representing the sensitivity threshold of the resin at 0.5 of the process, said oriented distance between the intersection of said sensitivity threshold straight line and, on a first part, the EL slope to the curve of the doses received at said point of reception and, a second part, the curve of the radiated dose.

Advantageously, the steps of calculation of the modulation of the radiated dose and of the adjustment of the pattern to be etched are repeated as long as the variation of radiated dose on a point of reception from one modulation calculation to the preceding one remains greater than a predetermined threshold value.

Advantageously, the step of calculation of the modulation of at least one radiated dose is applied by using a table of parameters.

Advantageously, the radiated doses in the interior area of the pattern before adjustment are all substantially equal to a normal dose.

Advantageously, the radiated doses in the interior area of the pattern before adjustment are all substantially equal to a percentage of a normal dose.

Advantageously, the percentage of a normal dose is set at a value substantially equal to 70% of said normal dose.

Advantageously, said adjustment comprises at least one spacing without radiation and at least one radiated dose.

Advantageously, a dose is radiated outside the pattern to be etched.

Advantageously, said at least one radiated dose outside the pattern to be etched is spaced apart from the pattern to be etched by a distance of between 0.2 times and 3 times the band width.

To implement the method, the invention also provides a computer program comprising program code instructions configured to execute a radiation lithography method of at least one pattern to be etched on a resin-coated support when the program is run on a computer, said program comprising a module for calculating the modulation of at least one radiated dose and a module for calculating at least one adjustment to be made to said pattern to be etched in at least one direction of the support, wherein said calculation of the adjustment to be made to the pattern is a function of the process energy latitude at the point where the radiated dose is received and in that the modulation of the radiated dose is modified according to said at least one adjustment of said at least one pattern.

The invention also offers the advantage of correcting the unfavorable effects of the methods for correcting proximity effects of the prior art, such as the loss of linearity, the increase in IDB (Isolated Dense Bias, i.e. the difference between the critical dimensions for isolated and dense structures), the increase in line end shortening (LES), the loss of precision due to the corner rounding effects, the reduced energy latitude (EL) which occur when these methods are applied. These defects in the methods for correcting proximity effects such as those described in U.S. Pat. No. 6,107,207 have been explained notably in the publication by S. Manakli, "New Electron Beam Proximity Effect Correction Approach for 45 and 32 nm Nodes", Japanese Journal of Applied Physics, vol. 45, no. 8A, pages 6462-6467.

Furthermore, given the modalities for calculating the corrections, an automation of the correction calculations in a way that is incorporated in the computer-assisted design tools is feasible, which provides the priceless advantage of offering the users of the system and of the method according to the invention an inexpensive conversion of their libraries of standard components.

BRIEF DESCRIPTION OF THE DRAWINGS

The invention will be better understood, its various features and advantages will emerge from the following description of a number of exemplary embodiments and its appended figures in which.

DETAILED DESCRIPTION

Figure 1A:
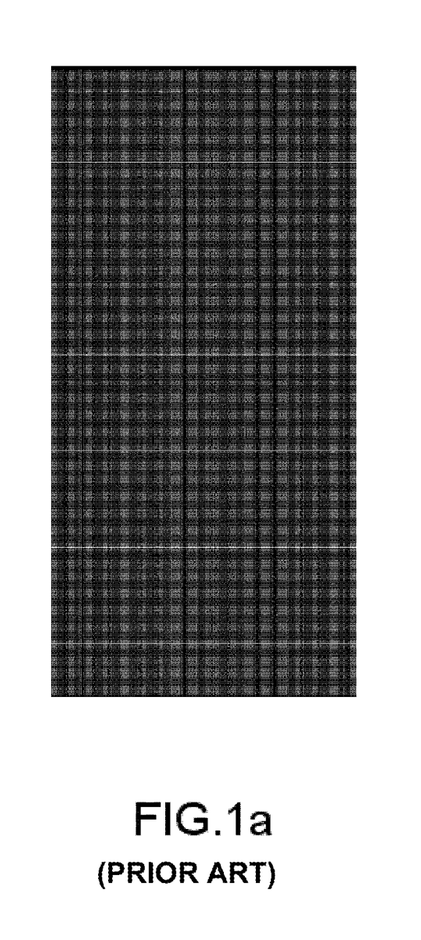
FIGS. 1a and 1b respectively schematically represent a network of dense lines to be etched and a distribution of the radiated doses after application of a correction method of the prior art to the radiated doses.
Figure 3:
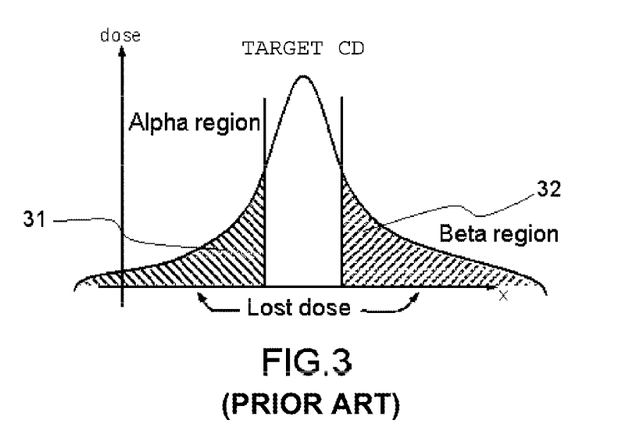
FIG. 3 represents the distribution of the radiated dose in a direction relative to the critical dimension.
Figure 4:
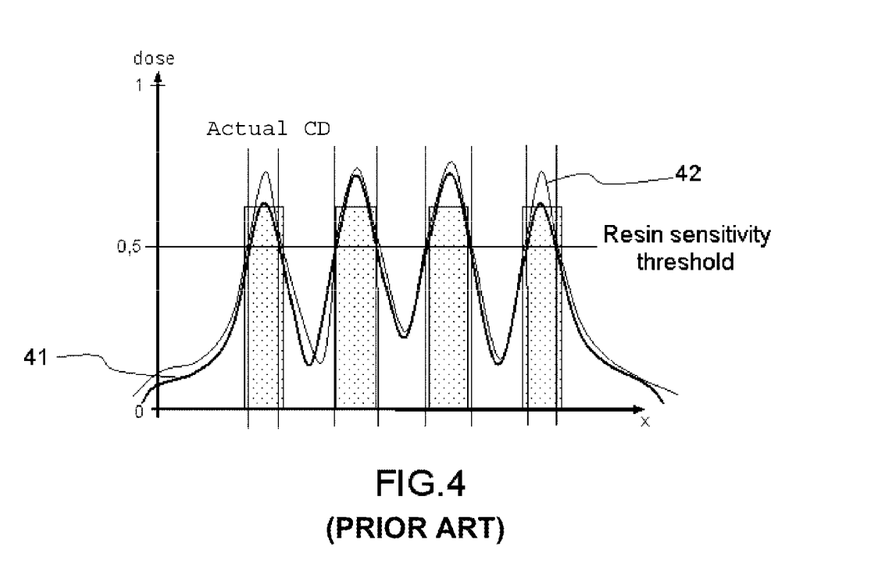
FIG. 4 represents the distribution of the radiated dose with and without proximity effects correction in the case of a network of dense lines.

FIG. 1a represents a dense network of lines to be etched on a portion of wafer or of mask. In the applications targeted by the method of the invention, the spacing between lines of the network will typically be from one to a few tens of nanometers. The electron beam or beams used to perform the etching of this network notably scatter over a short distance (forward scattering or blur) in the resin and the substrate on the edges of the center of the beam, which increases the size of the beam and reduces its contrast. Furthermore, the electrons are completely backscattered over a long distance (backward scattering). The distribution of radiated dose around the critical dimension that is sought for the etching in a cross-sectional plane of a line of the network is illustrated in FIG. 3. The regions alpha, 31, and beta, 32, of the different lines are superposed, which results in a deviation between the etched network and the designed network created by these proximity effects resulting from these scatterings which are mixed together. At the end of a line and the edge of the network, there is no superposition. The patterns of the network are therefore modified dissymetrically as illustrated on by the curve 41 of FIG. 4; the dose received at the edges of the network is lesser than that which is received interior area of the network.

A conventional method for correcting the proximity effects of a lithography method then consists in modulating the radiated doses by increasing those applied to the lines situated at the edges of the network to compensate for this relative lessening of exposure. The result of applying such a method on the radiated dose distribution is illustrated by the curve 42 of FIG. 4.

Correction methods of this type are described notably in U.S. Pat. No. 6,107,207 ("Procedure for generating information for producing a pattern defined by design information", inventors Wass, Hartmann) and in a number of publications, notably H. Eisenmann, T. Waas, H. Hartmann, "Proximity effect correction by convolution", J. Vac. Sci. Technol. B11 (6), 2741-2745 (1993). In the method described by these publications, the electronic lithography device applies to the resin-coated substrate, step-by-step, a dose of electronic radiation of an energy which is set as a function of the characteristics of the substrate, of the resin and of the patterns to be drawn. In the methods described by these publications, as in the method of the invention, it is possible to use any electronic lithography device, for example a VISTEC™ SB 3054 brand machine configured with PROXECCO™ brand dose modulation software.

The first step is to break down the pattern to be applied into unitary elements and then, for each unitary element, the radiated dose modulations are calculated.

Although the calculation using a convolution is one of the most effective, other types of calculation can be considered:
 a calculation based on Monte Carlo draw
 possibly, a calculation based on a total or partial search in precalculated tables
 it is also possible to have a convolution step which models the purely electronic effect followed by a calculation step which takes account of other phenomena which occur during the lithography step, such as the contribution of the resin, of the etching, or of other elements.

Figure 2:
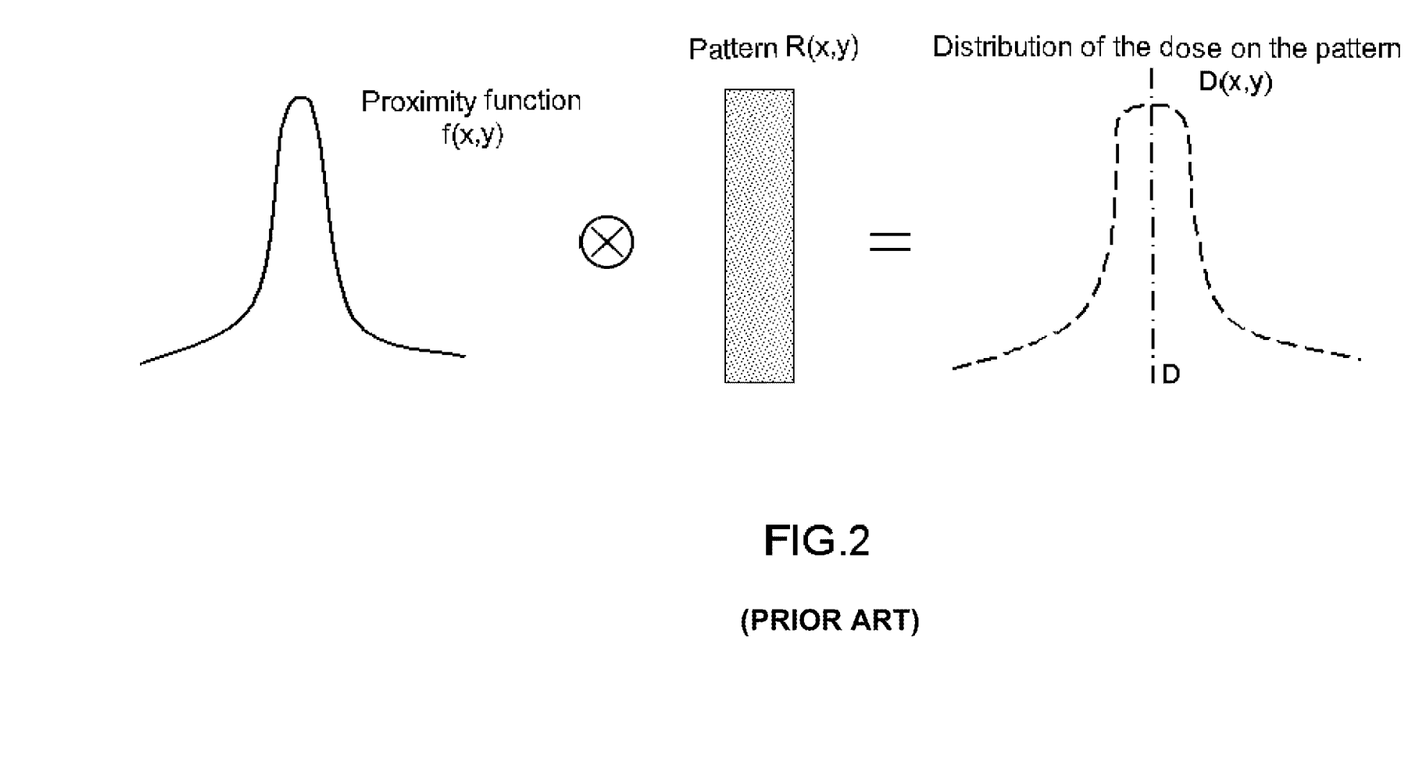
FIG. 2 graphically represents the proximity effects correction function applied by a method of the prior art.

In the case of the example described here, a convolution function of the distribution of the electrons in the material is applied to calculate the modulation to be applied to the radiation at each etching step. Said convolution function is given by FIG. 2 in which:
 $D(x,y)$ represents the distribution in the plane of the substrate $(x,y)$ of the dose received on the pattern to be etched;
 $f(x,y)$ represents the surface distribution of the dose emitted with modeling of the proximity effects; a Gaussian distribution of the proximity effects is generally assumed, as illustrated in FIG. 3; the distribution function is modeled by double integration of the proximity function (Point Spread Function, PSF) which is itself a combination of Gauss error functions (ERF function);
 $f(x,y)$ is modeled by the formula:

$$f(x, y) = \iint\limits_{x,y} \frac{1}{\pi(1+\eta)} \left( \frac{1}{\alpha^2} e^{-\frac{\xi^1}{\alpha^2}} + \frac{\eta}{\beta^2} e^{-\frac{\xi^2}{\beta^2}} \right)$$

With the following notations:
α is the width of the direct radiation;
β is the backscattering width;
η is the ratio of the intensities of the forward and backscattered radiations.

The values of the parameters α, β and η are determined by trial and error for a given method. These parameters are a function of the acceleration voltage of the machine. Typically for an acceleration voltage of the order of 50 KV, α is of the order of 50 nm, β of the order of 10 μm and η of the order of 0.5.

In this exemplary embodiment, a modeling of the errors with two ERF functions is used. It is also possible to use modelings of errors with one, three, four or even more ERF functions. It is also possible to use other types of modeling, for example polynomials.

R(x,y) is the geometry of the pattern to be drawn.

The impact of the radiated dose (shot) by the electronic device is therefore calculated by the formula:

$$D(x,y) = f(x,y) \otimes R(x,y)$$

The application of the inverse transformation (deconvolution) makes it possible to calculate the modulation to be applied to the radiated dose at each step of the process.

It is also possible to do the inversion other than by a deconvolution, for example by applying an optimization function, a resolution of a system of equations or an iterative procedure. Other exemplary embodiments are given in the present description.

Figure 1B:
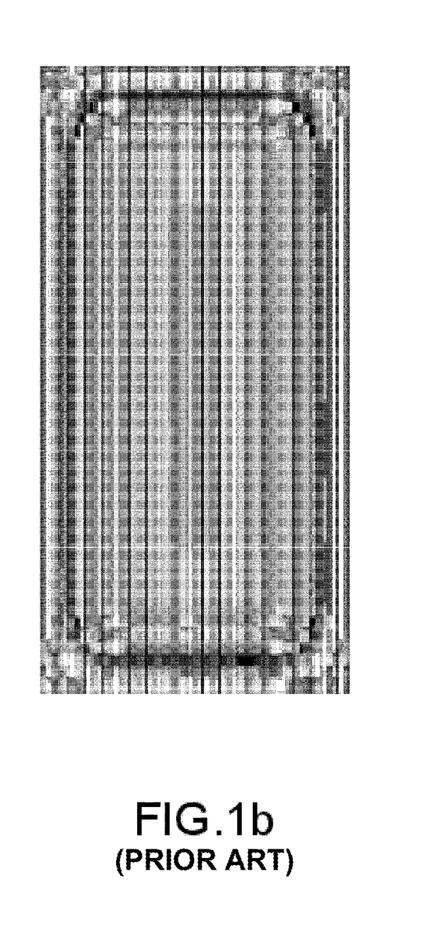

FIG. 1b illustrates the distribution of the radiated doses after application of the above correction method to the network of lines of FIG. 1a. The significant increase in the radiated doses to be applied at the edges of the network significantly increases the time of exposure, which is needed. This is a limitation of this prior art that the present invention overcomes. Typically, the exposure time has to be multiplied by a factor of 2 to 4 over the edges of the network compared to the interior area.

FIG. 5 represents, in a simplified manner, in the case of applying a prior art method described above, the distribution of the radiated doses over the entire width of the network in the modulation method described above (bars 51 of FIG. 5) as well as an areal view of this distribution (curve 52 of FIG. 5) which represents the process window. The straight line 53 represents the sensitivity threshold of the resin at 0.5 times the normal dose. The normal dose can be defined as being the dose needed to imprint, at their nominal size, dense patterns (for example line/space ratio=1) of large size (typically of the order of one micron). It is also commonly called "base dose".

Figure 5:
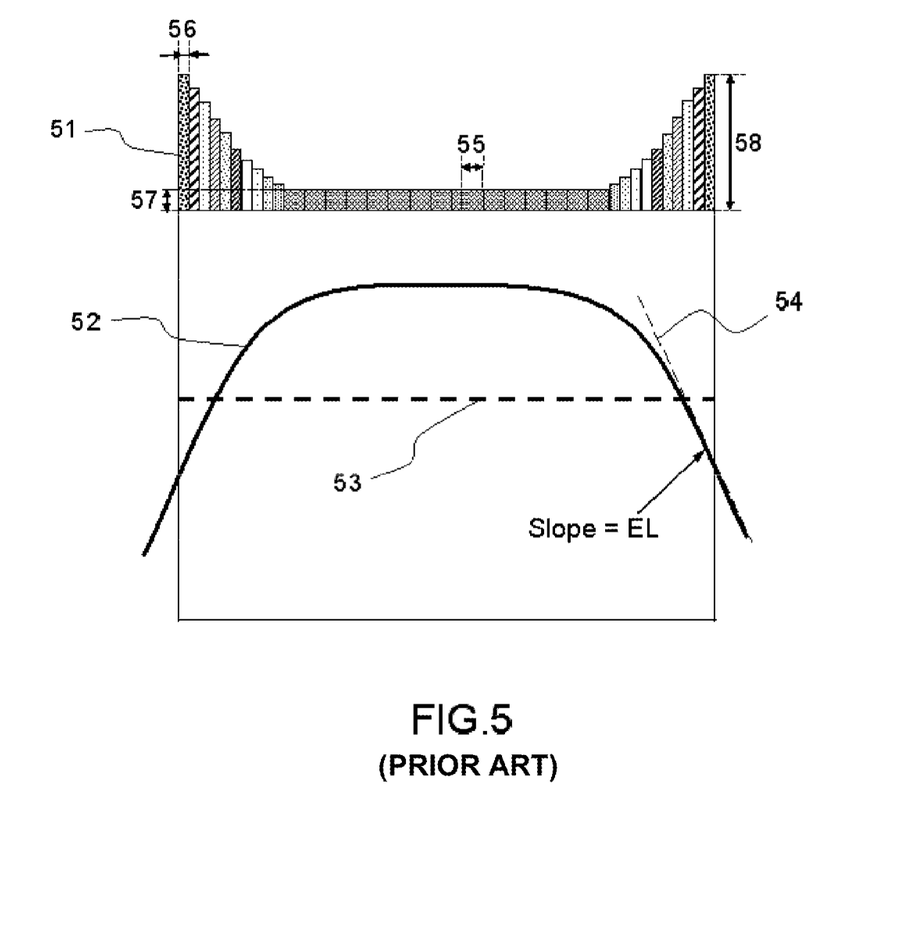
FIG. 5 represents a transversal view and an areal view of the radiated dose distribution showing the energy latitude.

A threshold of 0.5 is advantageous, but other values can also be set. The chosen threshold value then constitutes a parameter which can be chosen in the computer program written to implement the method of the invention.

The straight line 54 represents the process energy latitude slope at the point of the shot applied by the radiation device.

The dimension of a shot 55 situated in the interior area of the pattern here, in the exemplary embodiment described here, 1.6 μm×1.6 μm. Typically, the dose applied at these points distant from the edges of the pattern will be equal to the standard dose (normalized at 1). To correct the particularly sensitive proximity effects at the edges of the pattern, the devices of the prior art apply doses that are much higher (typically from 2 to 4, even 6) with smaller shot dimensions, typically 1 μm×1 μm. The increase in the exposure time therefore results both from the increase in the number of shots linked to the specific physical fracturing performed at the edges (almost double) and from the increase in the radiated doses on these shots at the edges of the design. In the exemplary embodiment illustrated in FIG. 5, ten or so shots are added, each of the added shots having a dose greater than unity (up to 6 times). The exposure time (proportional to the integral of the doses over the number of shots) is multiplied by approximately 3.6 compared to a uniform exposure (the aggregate—or integrated—dose changes from 25 to 90 normal doses).

Figure 6:
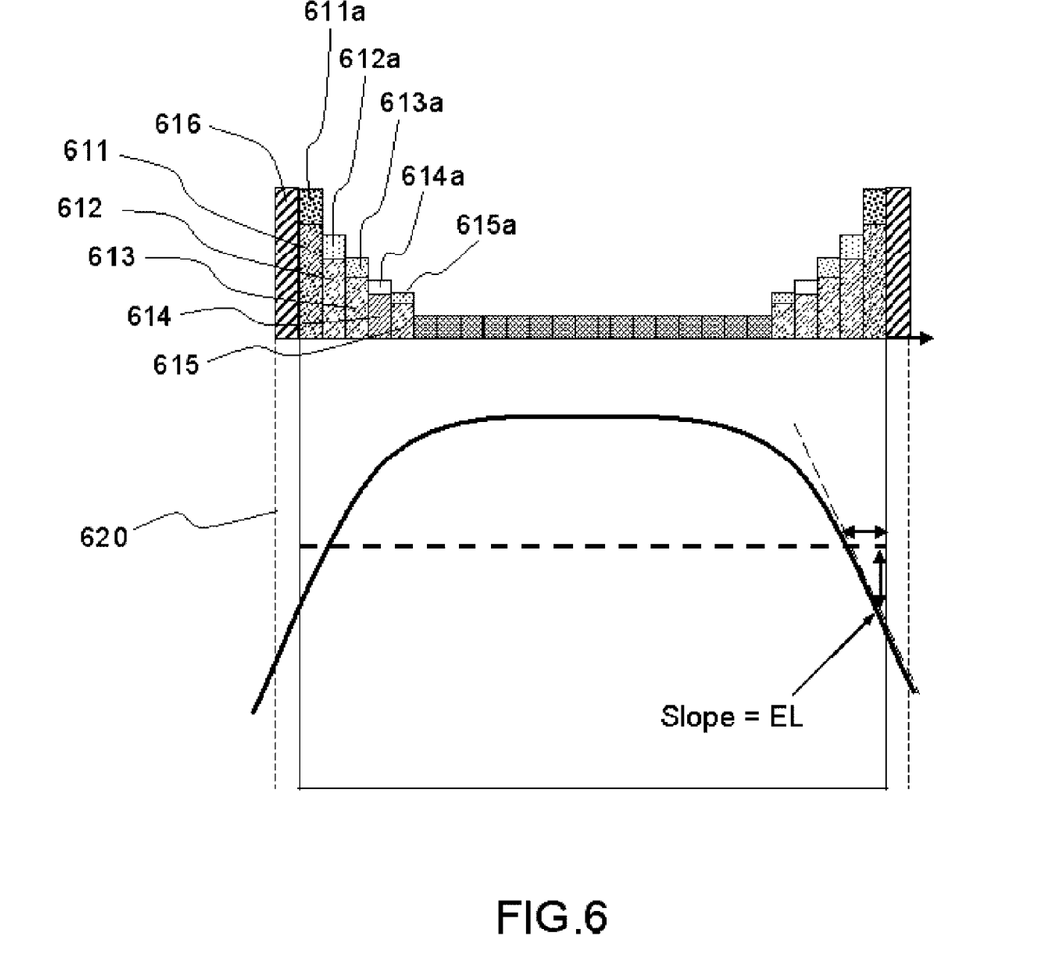
FIG. 6 illustrates the principle of optimization of the energy latitude on the edges of a network of dense lines according to one embodiment of the invention.
Figure 7:
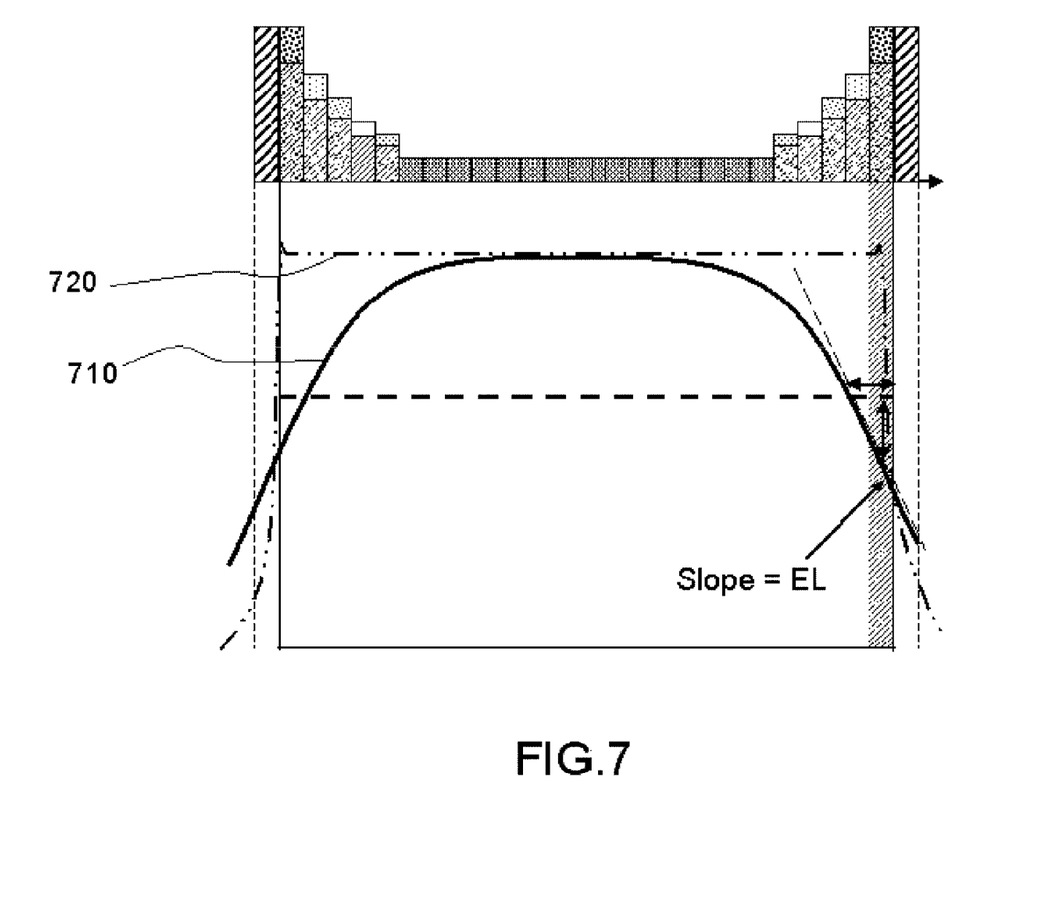
FIG. 7 shows the novel method window resulting from the application of the method of the invention in one of its embodiments.

The method of the invention and its distinctive characteristics compared to the methods of the prior art presented previously are illustrated by FIGS. 6 and 7 which should be read by comparison with FIG. 5.

FIG. 6 shows the radiation dose increases 611a, 612a, 613a, 614a, 615a (and their symmetrical points on the other edge of the network to be etched) which are applied by a prior art method and which can be eliminated by a method according to a first embodiment of the invention of the radiated doses 611, 612, 613, 614, 615 (as well as the radiated doses on the other edge of the network of lines to be etched).

These reductions in doses to be applied are obtained by widening the geometry of the drawing to be etched in proportions illustrated by the straight line 620 and by applying a dose 616 on the outer part of the new pattern. However, according to the invention, the shots on the edges retain the same dimensions as at the middle of the pattern (1.6 μm×1.6 μm in the example of the figure), which reduces the number of shots and therefore the exposure time, for example, in the case of the figure, by around 29% compared to a solution of the prior art (the aggregate dose changes from 90 to 64 normal doses), when the overdoses of each of the shots with dose modulation are reduced by approximately 0.25.

It is in fact found, by trial and error, that it is possible to eliminate the overdoses produced on the internal edges of the pattern to be etched, 611 to 615, without affecting the quality of the etched pattern. In this case, the exposure time saving is of the order of 62% (the aggregate dose changes from 90 to 34 normal doses). At the corners of the patterns, the saving is raised to the square and is therefore, in the above example, of the order of 86%. Thus, advantageously, according to a second embodiment of the invention, the same dose is applied over the entire pattern and the added band is "overdosed". This advantageous phenomenon is due to the fact that the added band allows at the same time to separate and to straighten the flanks of the dose curve as illustrated in FIG. 7, and do so in a much more effective manner than the increases in doses over a number of shots inside the pattern which have a lower efficiency because of the energy losses created by the proximity effects which interact among shots.

FIG. 7 illustrates the impact of the method of the invention on the curve of the dose received which is displaced from 710 to 720. The received dose resulting from the application of the method of the invention 720 thus exhibits, as illustrated, a straighter edge which is reflected in a greater energy latitude, and slightly offset toward the outside of the network, which reflects an elimination of the proximity effects. The modalities of the combined calculation of the radiated doses on each shot, of the widening of the edges of the network and of the energy latitude are explained later in the description in comments to FIGS. 9 and 10.

Figure 7A:
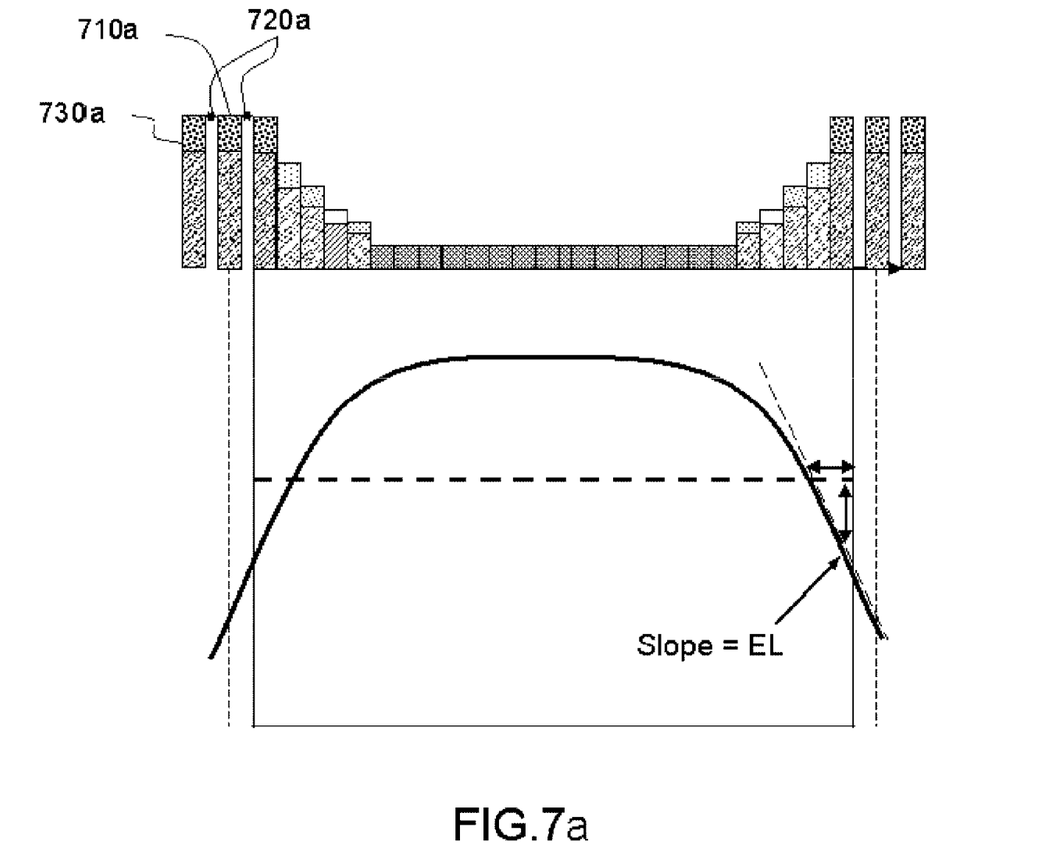
FIG. 7a illustrates the principle of optimization of the energy latitude on the edges of a network of dense lines according to one embodiment of the invention in which at least one pattern is etched outside said network.

FIG. 7a illustrates the principle of optimization of the energy latitude on the edges of a network of dense lines according to an embodiment of the invention in which at least one pattern is etched outside said network. Another advantageous embodiment consists in leaving a space, 620a, between the pattern to be etched and the added band, 610a, and, possibly, in adding at least one second external band, 630a, also separated from the first by a space. In all the configurations, this spacing enhances the process energy latitude. By trial and error, it is found that a spacing of between 0.2 times the band width and 3 times the band width is effective.

It is also found that, in the case where an overdose is applied to a band outside the pattern, the dose applied to the interior area of the pattern can be reduced, for example by 30%, to 0.7 times the normal dose without degrading the quality of the etching. Other values are, however, possible. These values constituting a parameter which can be chosen in the computer program configured to implement the method of the invention.

Figure 8A:
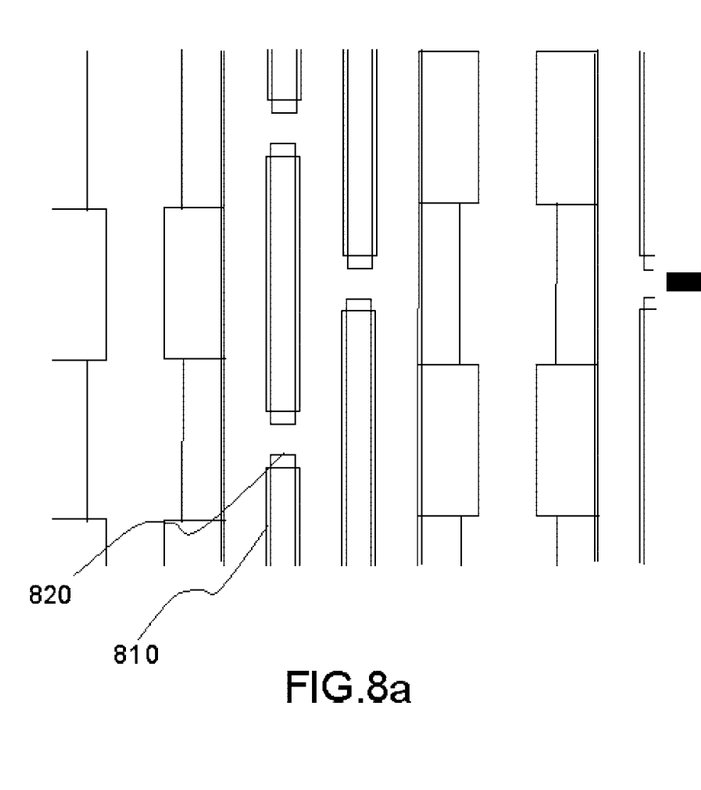
FIGS. 8a and 8b illustrate the results of the application of the method of the invention to a dense network.
Figure 8B:
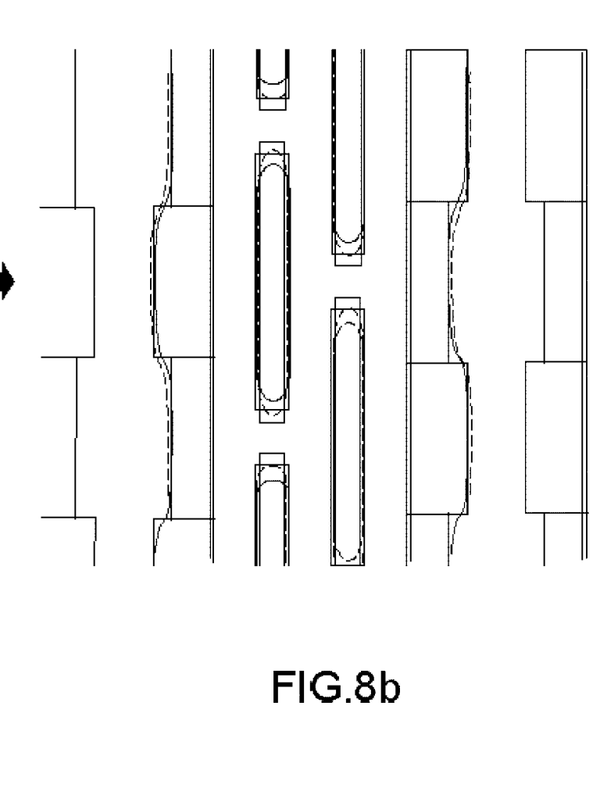

FIGS. 8a and 8b illustrate the results of the application of the method of the invention to a dense network.

FIG. 8a illustrates, on the one hand, the pattern to be etched, 810, on the other hand the pattern corrected by the method of the invention, 820.

FIG. 8b illustrates the pattern actually etched.

There are cases where the resizing is done toward the exterior and others where it is done toward the interior.

Figure 9:
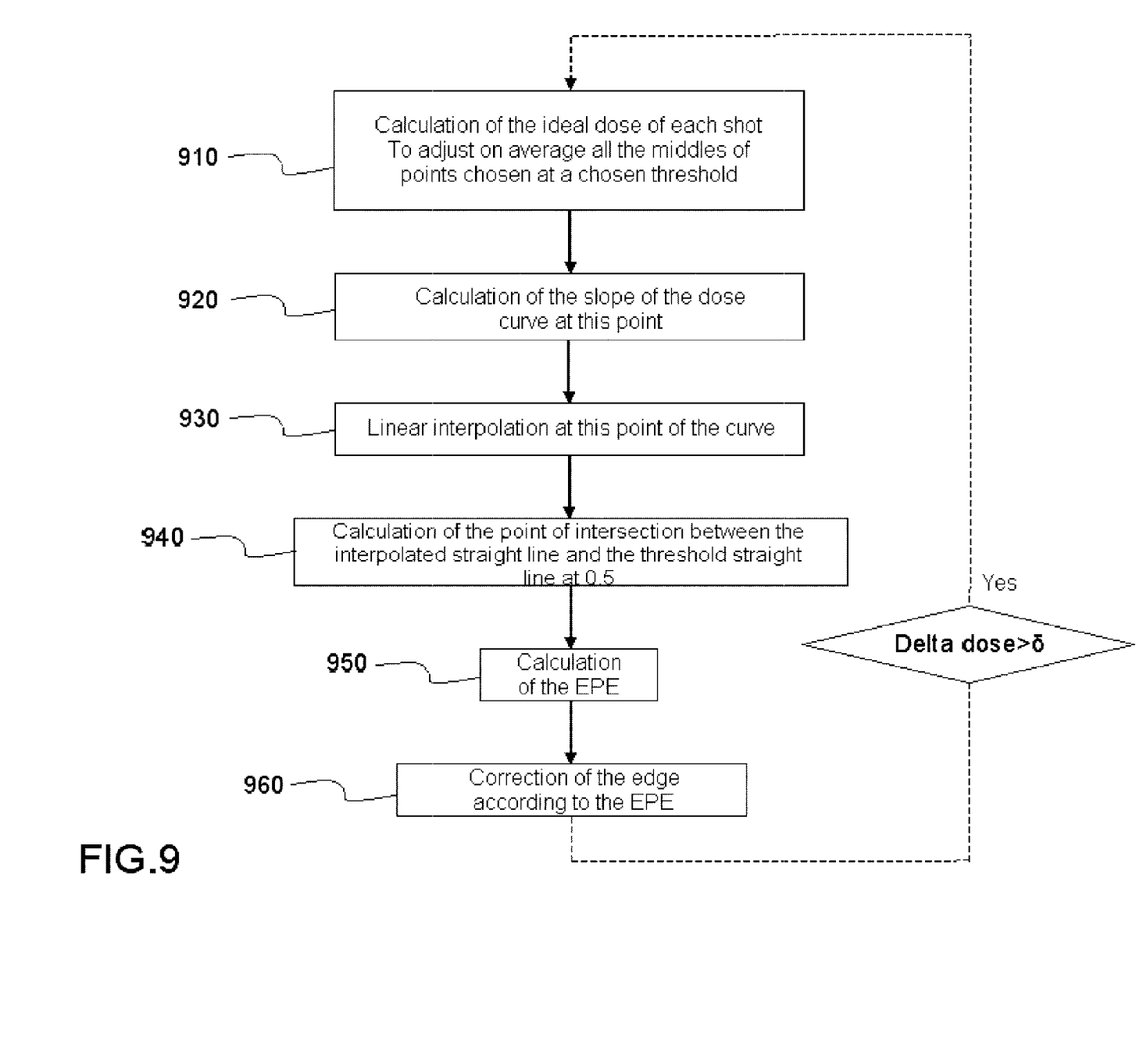
FIG. 9 represents a flow diagram of the central part of the method for implementing the invention according to one of its embodiments.

FIG. 9 represents a flow diagram of the central part of the method for implementing the invention according to one of its embodiments.

The example illustrated is that of a combination of a resizing of the patterns to be etched and of a dose modulation as represented in FIG. 6.

Conventionally for a person skilled in the art, the method of the invention begins with a reading of the design. The layout of the patterns to be etched is conventionally encoded in files in the GDS II (Graphic Data System version 2) or OASIS (Open Artwork System Interchange Standard) format. The data are normally grouped together by cell. The pattern to be etched is then pre-fractured into compatible subsets of the transfer device (direct electronic or ionic etching, fabrication of masks for electronic or optical etching, etc.).

Then, at step 910 of the method of the invention, the ideal dose of the shot is calculated in a way where, on average, all the middle points of the edges of the emitted shot are adjusted to the sensitivity threshold of the resin, for example to 0.5 times the normal dose, other values being possible. It is possible to set said threshold as a parameter in the computer program configured to implement the method of the invention.

At the next step, 920, the slope EL of the dose curve is calculated at this point; it is equal to the process window or energy latitude.

At the next step, 930, a linear interpolation is calculated at this point of the dose curve. At the next step, 940, the point of intersection between the linear interpolation and the threshold at 0.5 is calculated.

At the next step, 950, the edge placement error (EPE) is calculated, which is equal to the oriented distance between the point of intersection at the output of the step 940 and the edge of the shot.

At the next step, 960, the edge of the pattern to be etched is corrected by applying to the initial pattern the oriented distance at the output of the preceding step.

This basic method is adjusted to take account of the space available on either side of the pattern. If there is enough space to be able to add additional bands outside the pattern, that is the preferred solution. In this case, a uniform normal dose (or one reduced to 0.7, as indicated above) is applied at the interior area of the pattern in lieu of the modulations calculated everywhere except on the border(s) outside the pattern. The dose applied to the outside of the pattern of the initial design can be calculated by applying the convolution formulae explained above or by the use of a table of parameters drawn from trial and error.

In the case where the space is restricted, the resizing is limited and the results of the dose modulation calculation are used.

The dose modulation is then readjusted from the correction of the design. The correction method is repeated until the dose variation resulting from iteration loop to the next is lower than a threshold. Typically, the method is repeated two or three times to take account of the profiles introduced onto neighboring patterns. For example, a resizing of 500 nm is applied on initialization and the process stops at 1 or 1.5 µm. In this particular case the EL slope does not change from one iteration to another.

Finally, the data are converted to the machine format and the exposure is carried out.

Figure 10:
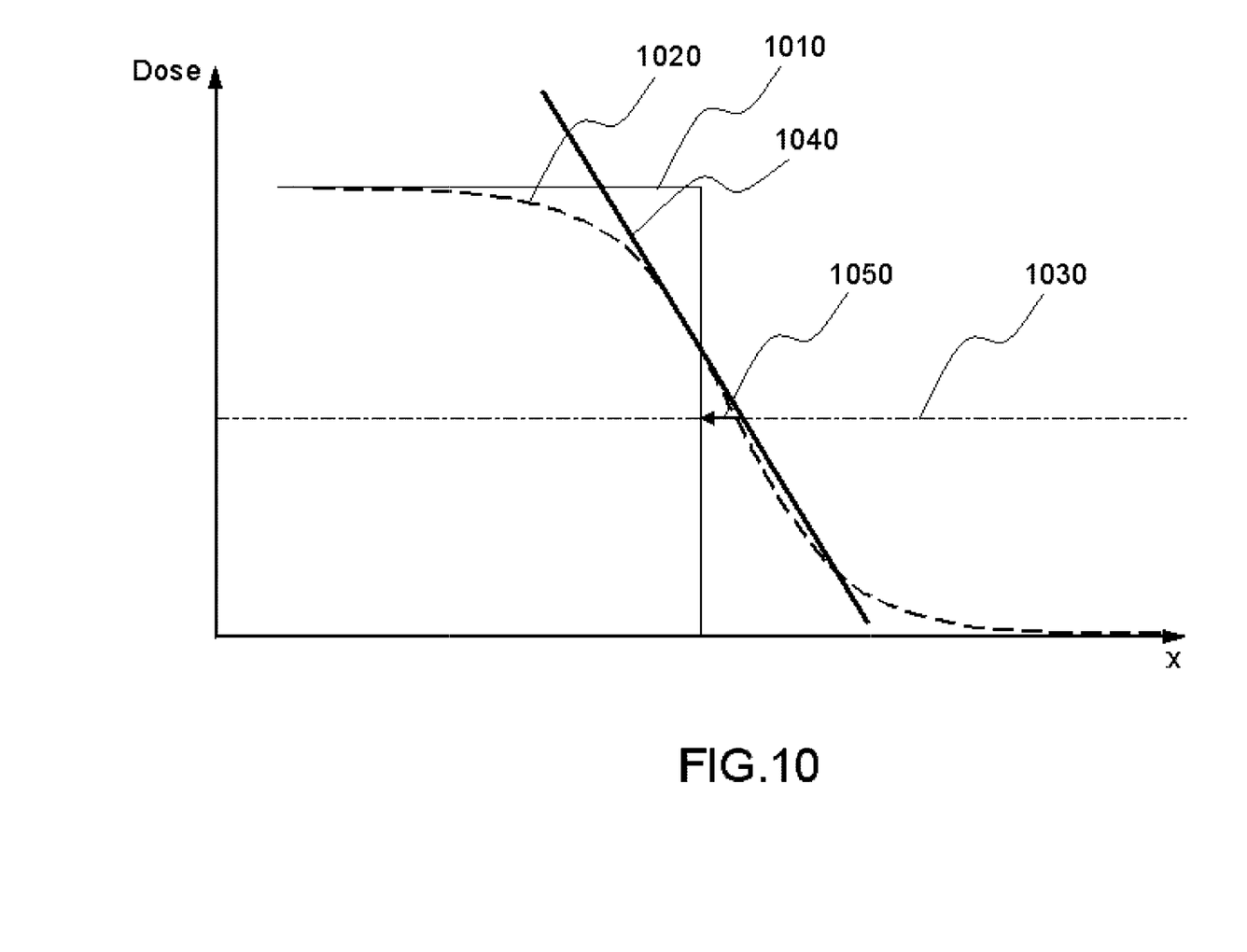
FIG. 10 graphically illustrates the central part of the proximity effects correction method in one embodiment of the invention.

FIG. 10 graphically illustrates the method of correcting the proximity effects in an embodiment of the invention.

The segments 1010 represent the initial shot.

The curve 1020 represents the received dose.

The straight line 1030 represents the threshold at 0.5.

The straight line 1040 represents the interpolated straight line at the output of the step 930.

The oriented segment 1050 represents the EPE which gives the correction applied to the initial pattern to be etched.

To implement the method of the invention, it is also possible to use different parameters which are related to the EL concept, for example:

contrast: (Imax−Imin)(Imax+Imin), where I here represents the received dose; the contrast is often used, notably for periodic patterns;

the ILS "logslope" is also commonly used: d(ln(dose))/dx or "normalized Image Log slope" NILS=ILS·CD.

These criteria can be used in lieu of the EL, which is defined as the slope of the Dose(x) curve.

The method of the invention has been described in an example of application to a direct writing electronic lithography method. It can also be applied to another direct writing method using other particles such as ions, photons or to electronic or optical lithography methods applied to masks.

The examples described above are therefore given by way of illustration of some embodiments of the invention. They in no way limit the scope of the invention which is defined by the following claims.

The invention claimed is:

1. A lithography method based on radiation of at least one pattern to be etched on a resin-coated support comprising:
    a step of calculation of the modulation of at least one radiated dose; and
    a step of calculation of at least one adjustment to be made to said pattern to be etched in at least one direction of the support,
    wherein said adjustment is a function of process energy latitude at the point where the radiated dose is received and the modulation of the radiated dose is modified according to said at least one adjustment of said at least one pattern.

2. The lithography method of claim 1, wherein the step of calculation of the modulation of at least one radiated dose is applied by convolution of said pattern with a distribution function of said radiated dose on said support.

3. The lithography method of claim 2, wherein said radiated dose is calculated before modulation that the average radiated dose is substantially of a value of the sensitivity threshold of the resin which is chosen as a parameter.

4. The lithography method of claim 3, wherein the resin sensitivity threshold parameter of the resin is chosen to be substantially equal to 0.5.

5. The lithography method of claim 3, wherein the process energy latitude (EL) at the point where the radiated dose is received is one of the slope of the tangent at this point to the curve of the received doses, the contrast of the radiated doses and the dose slope.

6. The lithography method of claim 5, wherein the adjustment to be made to the pattern centered on one of the points of reception of a radiated dose in at least one direction is calculated as being equal to the oriented distance on the straight line representing the sensitivity threshold of the resin at 0.5 for the process, said oriented distance being taken between the intersection of said sensitivity threshold straight line and, on a first part, the tangent with an EL slope to the curve of the doses received at said point of reception and, on a second part, the curve of the radiated dose.

7. The lithography method of claim 2, wherein the steps of calculation of the modulation of the radiated dose and of the adjustment of the pattern to be etched are repeated as long as the variation of radiated dose on a point of reception from one modulation calculation to the preceding one remains greater than a predetermined threshold value.

8. The lithography method of claim 1, wherein the step of calculation of the modulation of at least one radiated dose is applied by using a table of parameters.

9. The lithography method of claim 1, wherein the radiated doses in the interior area of the pattern before adjustment are all substantially equal to a normal dose.

10. The lithography method of claim 1, wherein the radiated doses in the center area of the pattern before adjustment are all substantially equal to a percentage of a normal dose.

11. The lithography method of claim 10, wherein the percentage of a normal dose is set at a value substantially equal to 70% of said normal dose.

12. The lithography method of claim 1 wherein said adjustment comprises at least one spacing without radiation and at least one radiated dose.

13. The lithography method of claim 1 wherein at least one dose is radiated outside the pattern to be etched.

14. The lithography method of claim 13, wherein at least one radiated dose outside the pattern to be etched is spaced apart from the pattern to be etched by a distance of between 0.2 times and 3 times the band width.

15. A non-transitory computer readable medium storing a computer program comprising program code instructions configured to execute a radiation lithography method of at least one pattern to be etched on a resin-coated support when the program is run on a computer, said program comprising a module for calculating the modulation of at least one radiated dose and a module for calculating at least one adjustment to be made to said pattern to be etched in at least one direction of the support, wherein said calculation of the adjustment to be made to the pattern is a function of the process energy latitude at the point where the radiated dose is received and in that the modulation of the radiated dose is modified according to said at least one adjustment of said at least one pattern.

\* \* \* \* \*